United States Patent
Brodsky

(10) Patent No.: US 8,804,290 B2
(45) Date of Patent: Aug. 12, 2014

(54) ELECTROSTATIC DISCHARGE PROTECTION CIRCUIT HAVING BUFFER STAGE FET WITH THICKER GATE OXIDE THAN COMMON-SOURCE FET

(75) Inventor: Jonathan Brodsky, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 124 days.

(21) Appl. No.: 13/351,395

(22) Filed: Jan. 17, 2012

(65) Prior Publication Data

US 2013/0182357 A1 Jul. 18, 2013

(51) Int. Cl.
*H02H 9/04* (2006.01)

(52) U.S. Cl.
USPC .............................................. 361/56

(58) Field of Classification Search
CPC ...... H02H 9/04; H02H 9/046; H01L 27/0251; H01L 27/0266

USPC ............................................... 361/56
See application file for complete search history.

(56) References Cited

U.S. PATENT DOCUMENTS 6,972,446 B1 * 12/2005 Atsumi ..................... 257/208

* cited by examiner

*Primary Examiner* — Jared Fureman
*Assistant Examiner* — Kevin J Comber
(74) *Attorney, Agent, or Firm* — Jacqueline J. Garner; Frederick J. Telecky, Jr.

(57) ABSTRACT

An active-FET ESD cell (300) for protecting an I/O pad (301) includes a first MOS transistor (310) with a gate oxide (315) of a first thickness and a second MOS transistor (320) with a gate oxide (325) of a second thickness greater than the first thickness at least by the amount required to handle the source-follower threshold voltage, the first transistor having its drain (313) tied to the I/O pad, its source (311) tied to ground, and its gate (312) tied to the source (321) of the second transistor and resistively connected to ground (340), and the second transistor having its drain (323) tied to the I/O pad and its gate tied to a capacitor (330) connected to the I/O pad and to a resistor (331) connected to ground.

14 Claims, 3 Drawing Sheets

ELECTROSTATIC DISCHARGE PROTECTION CIRCUIT HAVING BUFFER STAGE FET WITH THICKER GATE OXIDE THAN COMMON-SOURCE FET

FIELD OF THE INVENTION

The present invention is related in general to the field of semiconductor devices and processes, and more specifically to the structure and fabrication method of high-voltage electrostatic discharge protection circuits employing MOS transistors with dual gate oxide thicknesses.

DESCRIPTION OF RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the "Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

One common scheme to protect an input/output (I/O) pad against ESD failure uses metal-oxide-semiconductor (MOS) devices, such as nMOS transistor with its drain connected to the pin-to-be-protected and its source tied to ground, and relies on the mode of a parasitic bipolar transistor (the source acts as the emitter, the drain as the collector, and the bulk semiconductor as the base) during an ESD event to provide a low impedance current path to ground. The protection level or failure threshold can be set by varying the nMOS device width.

The current carrying capability of the device is limited by thermal effects in the avalanching collector depletion layer. A number of effects (such as the increase of intrinsic carrier concentration, a reduction of carrier mobility, a decrease in thermal conductivity, and a lowering of the potential barrier for tunnel currents) contribute to the onset of thermal runaway, the second (thermal) breakdown. The reduction of the impact ionization current is offset by the thermal generation of carriers. Second breakdown, initiated in a device under stress as a result of self-heating, is characterized by the trigger current $I_{t2}$, which is very sensitive to the device design, especially the doping profiles; it results in junction melting and in an irreversible increase in leakage currents.

In semiconductor products using analog technologies supporting high voltages between about 10 V and more than 100 V, popular ESD protection circuits employ MOS field-effect transistors (MOSFETs) in normal saturation mode to discharge currents between about 0.75 and 5 A. The transistors are frequently drain-extended (DE) in order to provide high-voltage clamps. The ESD protection circuits are frequently referred to as Active-FET cells. In these cells, a first FET, called the common-source transistor $N_1$, discharges the current to ground from an ESD event hitting the input node, after its gate has been charged and turned on by the current $I_{dsN2}$ of a second FET, called the source-follower buffer transistor $N_2$. Transistor $N_2$, in turn, has been turned on by the displacement current $I=C \cdot dV/dt$ from a capacitor C connected to the input node, wherein I flows during the rising edge of the ESD event, charging the gate of $N_2$. Conventionally, ESD cells designed to turn on during the rising edge of an ESD event are called edge-rate triggered cells; the high-pass filter formed by C and its resistor R to ground is designed to respond to ESD events but not to normal operating transients.

Since the channel width of transistor $N_1$ is designed to handle the ESD discharge current in saturation mode, the transistor has a large area. Designed as an interdigitated multi-finger large-area device, transistor $N_1$ may have 300 fingers or more, each with a width of 100 μm. The gate of discharge transistor $N_1$ could be driven directly by C/R. But since $N_1$ needs to be large to discharge an event current between about 0.75 and 5 A, C would also need to be large in order to provide sufficient current and gate voltage. Consequently, the source-follower buffer stage using transistor $N_2$ provides a more area-efficient gate drive for discharge transistor $N_1$, a common-source FET; it is more economical in terms of area to use a second transistor $N_2$ together with first transistor $N_1$, than just a single transistor alone. Using the source-follower $N_2$ buffer stage to drive a common-source FET ($N_1$) reduces the area required for the boot capacitor $C_1$ and allows the trigger and discharge time-constants to be decoupled.

In known technology, both transistor $N_1$ and transistor $N_2$ are provided by the same type field effect transistor, commonly nMOS; these transistors use the same gate-oxide made by identical fabrication and with identical thickness.

SUMMARY OF THE INVENTION

Analyzing Active-FET cells used by conventional technology for ESD protection, applicant recognized that, based on the fact of single gate oxides and oxide thickness for both the common-source and source-follower buffer FETs, the common-source FET suffers from a sub-optimum gate drive due to gate reliability constraints and body-effect in the source-follower buffer FET. In order to overcome the body effect, the common-source and source-follower FET area would have to be increased—an unacceptable approach because it would be in the opposite direction of the technology trend of scaling and shrinking device outlines.

Applicant further realized that another option for eliminating the reliability constraints and body-effect would be the isolation of the source-follower FET. This option is, however, not acceptable because the fabrication of the isolation would increase overall process complexity and thus add significantly to the fabrication cost, and the isolation would need to be connected either to the gate of the common-source FET, adding capacitance to the common-source FET gate and degrading the drive of the common-source FET, or to the pad-to-be-protected, which is not always physically possible for high-voltage DEMOS transistors.

Applicant discovered that the problem of sub-optimum gate drive of the common-source FET can be solved by using dual gate-oxide DEMOS transistors for the Active-FET protection cell. Specifically, the source-follower buffer FET has a gate oxide thicker than the common-source FET by at least an amount to handle the expected source-follower threshold voltage. Frequently, the source-follower buffer FET may have a gate oxide at least twice as thick as the gate oxide of the common-source FET. With this solution, the gate-drive of the common-source FET can be optimized and the area of both the common-source FET and the source-follower FET can be minimized even in the presence of reliability constraints and body effect. The source-follower FET does not need to be isolated to achieve improved gate-drive for the common-source FET.

In an embodiment of the invention fabricated under the design guide lines of the 180 nm technology node, the gate oxide of the source-follower buffer FET is about 13.0 nm thick, while the gate oxide of the common-source FET is about 4.5 nm thick. Compared to an analogous protection cell fabricated with conventional technology using equally thick gate oxides, the number of fingers for the DEMOS FETs can be significantly reduced so that the area required for the protection cell can now be reduced to approximately 87,000 μm² from 188,000 μm².

The dual gate-oxide concept of the invention can be implemented for nMOS as well as pMOS transistors, and for other ESD protection cell designs such as level triggering.

DETAILED DESCRIPTION OF THE PREFERRED EMBODIMENTS

Figure 1:
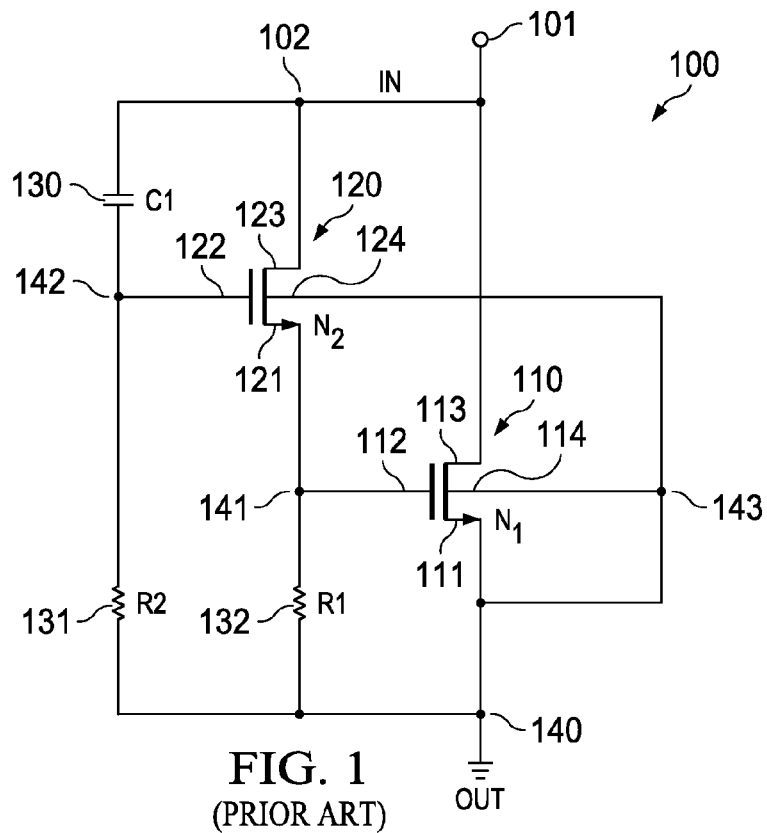
FIG. 1 is a schematic circuit diagram of an active-FET ESD protection cell according to conventional technology/

FIG. 1 illustrates an electrostatic discharge circuit of known technology, generally designated 100, protecting an input pin 101 against damage from an electrostatic discharge (ESD) event. The protection circuit of FIG. 1 is frequently referred to as an Active-FET cell, or actFET cell, since it includes two MOS transistors: First transistor $N_1$, designated 110 and called the common-source transistor, and second transistor $N_2$, designated 120 and called the source-follower buffer transistor. Both transistors are typically enhancement mode drain-extended (DE) nMOS transistors, operating in normal saturation mode to discharge currents between about 0.75 and 5 A. Following the quoted nomenclature, the stage with DEnMOS transistor $N_1$ is called the common-source stage, and the stage with DEnMOS transistor $N_2$ is called the source-follower stage.

While the description of the invention frequently refers to protecting input/output (I/O) terminals, or input pins, with respect to ground, it should be stressed that these statements are not intended to be construed in a limiting sense. On the contrary, the ESD cell described can also be used to protect power supply pins and a multitude of other pins, and is thus widely applicable.

Figure 2:
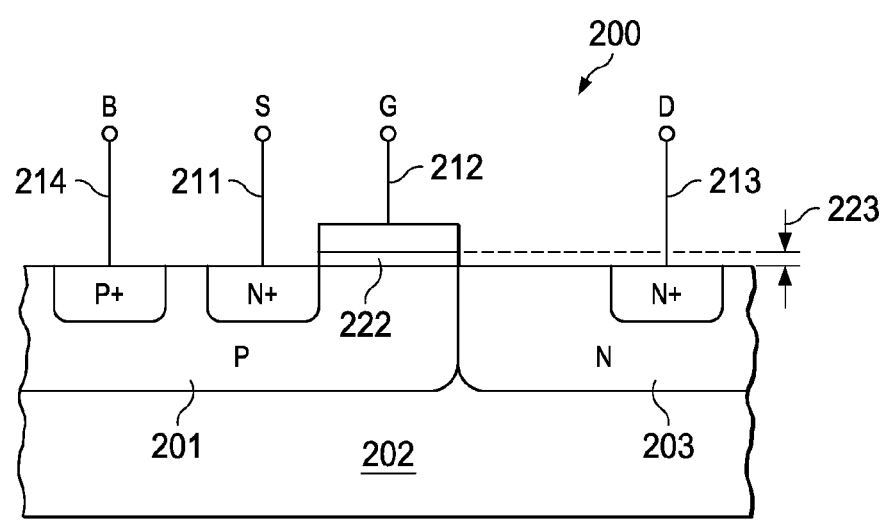
FIG. 2 shows a cutaway of a drain-extended n-type MOS field effect transistor.

An example of a drain-extended (DE) MOS field-effect transistor (MOSFET) operable as a high voltage clamp for analog semiconductor products supporting high voltages (between about 10 and >100 V) is shown in FIG. 2. The DEMOS transistor, generally designated 200, is of nMOS type. In this example, p-type epitaxial material 201, grown on starting silicon 202, has body contact 214. Source 211 and drain 213 contacts use heavily doped n-type regions. The contact region for drain 213 is extended by a less heavily doped n-type region 203. Gate contact 212 is separated from the p-type material 201 by gate oxide layer 222, typically silicon dioxide. Oxide layer 222 has thickness 223, which is determined by the fabrication technology of the transistor. In the exemplary MOS transistor of FIG. 2, gate 212 has to be positive relative to source 211 in order to turn on.

Referring now to cell 100 in FIG. 1, the transistor 110 discharges the event current to ground 140, when an ESD event hits the input pin 101, after gate 112 of transistor 110 has been charged with positive gate voltage and turned on by the current $I_{dsN2}$ of transistor 120.

As illustrated in FIG. 1, node 141 is tied to gate 112 of transistor $N_1$ (110); the voltage from node 141 to ground is denoted as $V_{gsN1}$. Node 142 is tied to gate 122 of transistor $N_2$ (120); the voltage from node 142 to ground is denoted as $V_{gbN2}$. Using these denotations, an analysis of an actFET protection cell reveals the limitations and shortcomings of a conventional cell as shown in FIG. 1. Transistor 120 is turned on by the displacement current $$I=C_1 \cdot dV/dt$$

of capacitor $C_1$ (designated 130), which is connected to input node 101. The turn-on of transistor 120 is herein referred to as RC trigger. Displacement current I flows during the rising edge of the ESD event, generating positive voltage at gate 122 of transistor 120. The voltage at gate 122 of transistor $N_2$ (120) is limited by its maximum allowed gate-body voltage $V_{gbmaxN2}$ (the node 143 of body 124 of transistor 120 is shared with body 114 of transistor 110).

Since source 121 and body 124 of transistor 120 are at different potentials (source 121 is positive compared to ground node 140 and thus to its own body 124), the threshold voltage $V_T$ of transistor 110 is increased. The increase of threshold voltage $V_T$ of transistor 120 relative to the case where source and body are at the same potential is commonly referred to as body effect. As a consequence it is harder to turn on transistor 120, given the reliability of its gate oxide. With the voltage at node 141 lower, the voltage at gate 112 of transistor 110 is also lower, since both transistors 110 and 120 have the same gate oxide characteristics.

Due to the fact that transistor $N_2$ (120) and transistor $N_1$ (110) have the same gate oxide thickness and same gate oxide type, the following equation holds for the maximum voltage between gate 112 and source 111 of transistor $N_1$ (110):

$$V_{gsmaxN1}=V_{gbmaxN2}.$$

The gate voltage $V_{gbN2}$ of transistor 120 is limited by its maximum allowed voltage $V_{gbmaxN2}$.

In conventional technology, both transistors 110 and 120 have identical gate oxides. Consequently, the following condition holds:

$$V_{gsN1}=V_{gbN2}$$

$$V_{gsN1}<V_{gbN2}.$$

This fact reveals that transistor 110 cannot get the maximum gate drive:

$$V_{gsN1}<V_{gsmax};$$

The discharge cell 100 suffers from a sub-optimum gate drive of transistor 110, and thus, with regard to the currents, $$I_{dsN1}<I_{dsmax}.$$

In order to compensate for this shortcoming and bring the drive capability of transistor $N_1$ (110) to its maximum capability, conventional technology suggests the route of increasing the area of transistor N₁ (110) to a larger area; this suggestion is, however, in a direction diametrically opposed to the market trend.

Transistors 110 and 120 operate in saturation mode. Denoting the width of a transistor channel with W, the length of the drain-to-source channel with L, and the threshold voltage for turn-on of the channel conductance with $V_T$, the current $I_{ds}$ is given by:

$$I_{ds} = \text{const} \cdot W/L \cdot (V_{gs} - V_T)^2.$$

Threshold voltage $V_T$ is increased relative to the threshold voltage $V_{T0}$ at zero source-body voltage due to the body effect, since source 121 and body 124 of transistor 120 are at different potentials: Source 121 is tied through node 141 to gate 112 of transistor 110 and connected through resistor 132 to ground, while body 124 is tied through node 143 to body 114 of transistor 110 and connected directly to ground. As a consequence, source 121 is positive compared to ground node 140. The connections shown in FIG. 1 for transistors 110 and 120 are a consequence of the fact that transistor 120 is not isolated relative to transistor 110, since source-follower isolation would significantly increase the process complexity; in addition, the isolation has to be connected to either node 141 or node 102 (IN node). Connecting the isolation to node 141 is adding capacitance to gate 112, which would degrade the drive of transistor 110; connecting the isolation to node 102 is not always physically possible for high-voltage DEMOS, especially for high-voltage devices >20 V.

Figure 3:
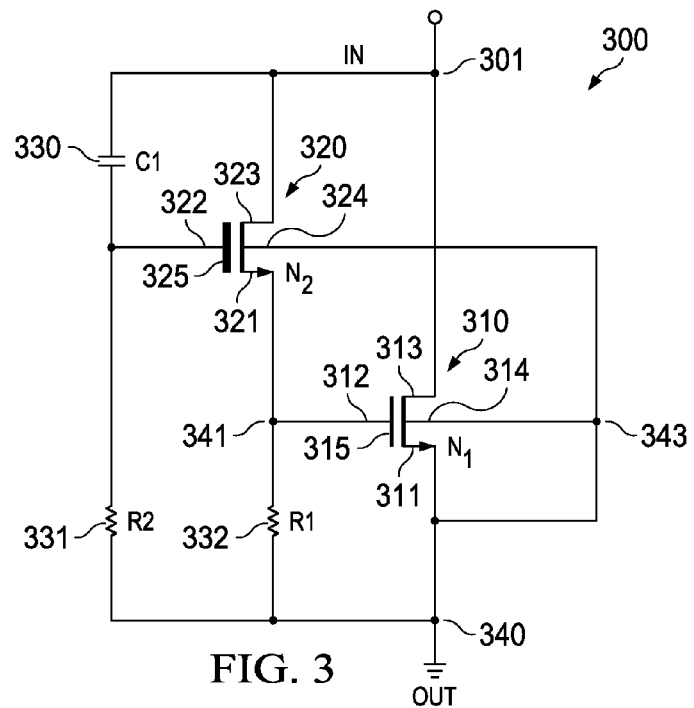
FIG. 3 is a schematic circuit diagram of an active-FET ESD protection call according to the invention, including different gate oxide thicknesses for the common source FET and the source-follower buffer FET.

FIG. 3 illustrates an exemplary embodiment of the invention based on standard CMOS technology. The exemplary active-FET cell, generally designated 300, protects an I/O pad of an IC against electrostatic discharge events. While many products belong to nMOS technology, it should be noted that the approach of the invention is equally applicable to pMOS. The embodiment belongs to the large family of analog semiconductor products and comprises a device for protecting an input/output (I/O) pad of an IC in a semiconductor body against electrostatic discharge events. A first drain-extended (DE) nMOS transistor 310, herein also referred to as N₁ or common-source FET, is formed in the p-type semiconductor body and has node 343 as its body contact 314. Transistor 310 has an oxide 315 of a first thickness and a gate 312 on oxide 315. The gate oxide of transistor 310 is referred to as core-oxide. The thickness of oxide 315 depends on the fabrication technology used. As an example, when 180 nm technology is used, the thickness of oxide 315 is preferably between about 4.5 nm and 5.0 nm. For other technology generations, stretching from 65 nm to 250 nm technologies, first oxide thickness may be between about 2.0 nm and 8.5 nm. These oxides support core voltages and herein referred to as core-oxides. Further designations in FIG. 3 indicate for transistor 310 the source 311 and the drain 313.

As FIG. 3 shows, first transistor 310 has its drain 313 tied to I/O pad 301, its source 311 tied to ground 340 and its gate 312 tied to source 321 of second transistor 320 and further connected resistively to ground (resistor designated 332).

In the exemplary embodiment of FIG. 3 is further a second drain-extended nMOS transistor 320, herein also referred to as N₂ or source-follower buffer FET. Second transistor 320 is formed in the p-type semiconductor body and has its body contact 324 tied to node 343. Transistor 320 has an oxide 325 of a second thickness and a gate 322 on oxide 325. The gate oxide of transistor 320 is referred to as I/O oxide. The source-follower buffer FET has a gate oxide thicker than the common-source FET by at least an amount to handle the expected source-follower threshold voltage. Frequently, the source-follower buffer FET may have a gate oxide at least twice as thick as the gate oxide of the common-source FET. The thickness of oxide 325 depends on the fabrication technology used, which for CMOS products can routinely produce dual gate oxide thicknesses in DEMOS production. As an example, when the 180 nm technology is used, the thickness of oxide 325 is preferably between about 12.5 nm and 13.5 nm. For other technology generations, stretching from 65 nm to 250 nm technologies, second oxide thickness may be between about 4.0 nm to 20.9 nm. These oxides support I/O operating voltages and are herein referred to as I/O-oxides. Further designations in FIG. 3 indicate for transistor 320 the source 321 and the drain 323.

As FIG. 3 shows, second transistor 320 has its drain 323 tied to I/O pad 301, and its gate 325 tied to capacitor 330 connected to the I/O pad 301, and to resistor 331 connected to ground.

Having a thick gate oxide for the source-follower buffer FET 320 (N₂), relative to the thin gate oxide of the common-source FET 310 (N₁), allows a higher gate voltage for transistor 320:

$$V_{gbN2\text{-}max} > V_{gsN1\text{-}max},$$

as physical limit, and $$V_{gsN1} < V_{gbN2},$$

as operating situation. This advantage, in turn, allows gate 315 of transistor 310 to be reliably driven to full voltage in operation:

$$V_{gsN1} = V_{gsN1\text{-}max},$$

and consequently allows for the current:

$$I_{dsN1} = I_{dsN1\text{-}max}.$$

Since the DEnMOS 320 with the thick I/O-oxide allows gate 315 of transistor 310 (N₁) to be driven to full voltage of its thin gate oxide, this core-oxide DEnMOS 310 achieves peak drive-current at a lower gate voltage than the I/O-oxide DEnMOS 320. Consequently, active-FET cell 300 utilizes optimum DEnMOS drive currents even with the occurrence of the source-follower body effect discussed above. This capability results in significant real-estate savings for the semiconductor area consumed by cell 300.

Figure 4:
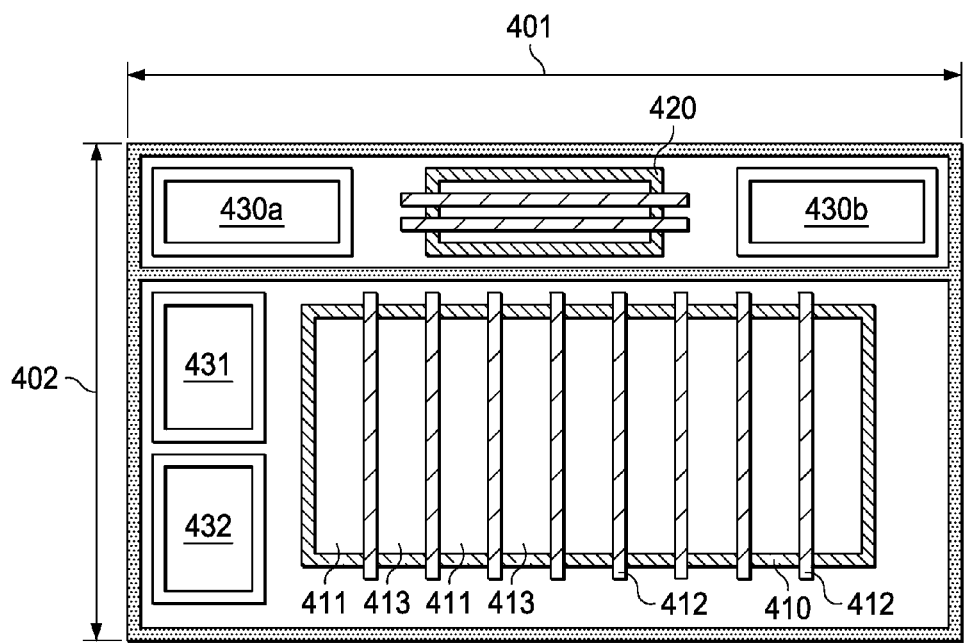
FIG. 4 illustrates a simplified top view of an ESD protection cell with FETs according to the invention.

FIG. 4 shows schematically a layout of an exemplary protection cell according to the invention; details of the layout have been simplified for clarity reasons. The exemplary cell is a 12 V DEnMOS actFET fabricated under the conditions of the 180 nm technology node. The perimeter of the cell has a length 401 of about 423 µm and a width 402 of about 205 µm so that the cell consumes about 86,715 µm² of circuit area. Included in this area are the area for DEnMOS transistor 410 [which has been designated N₁ (or 310) in FIG. 3]; the area for DEnMOS transistor 420 [which has been designated N₂ (or 320) in FIG. 3]; the area for capacitor C₁ (430a and 430b); and the areas 431 for resistor R₁ and 432 for resistor R₂. According to the invention, transistors 410 and 420 have different gate oxides thicknesses; transistor 410 has gate oxides of about 4.5 nm thickness, and 140 fingers of 100 µm width each; and transistor 420 has gate oxides of about 13.0 nm, and 10 fingers of 100 µm width each. FIG. 4 depicts only a small number of transistor fingers; for instance for transistor 410, they are designated 411 for source, 413 for drain, and 412 for gate.

Figure 5:
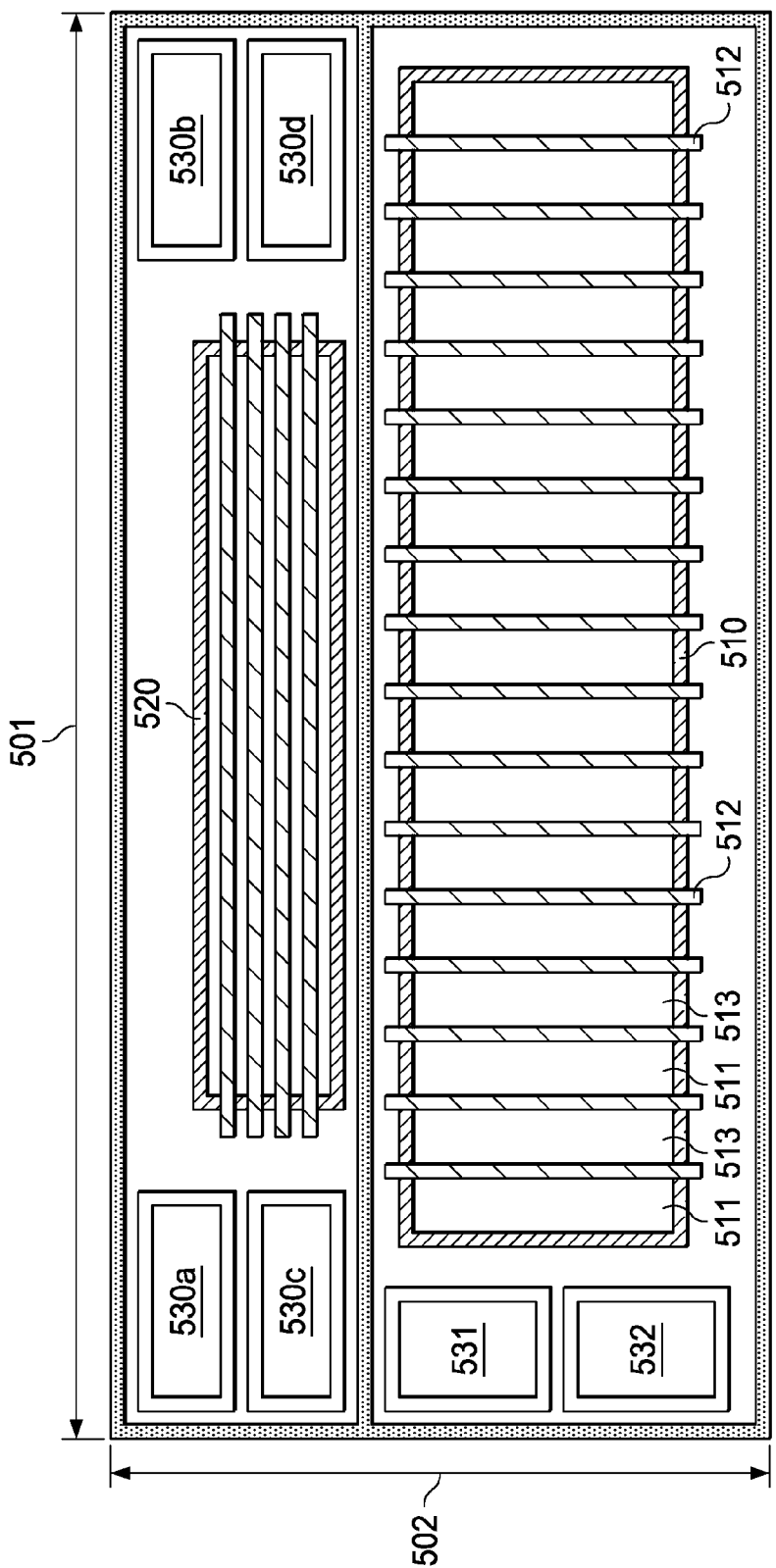
FIG. 5 depicts a simplified top view of an ESD protection cell with FETs according to conventional technology.

As comparison to the exemplary protection cell shown in FIG. 4 according to the invention, FIG. 5 is drawn to the same scale to illustrate a 12 V DEnMOS cell with equal clamping voltage during ESD and fabricated under the same conditions of the 180 nm technology node, but with equal gate oxide thickness for both transistors according to conventional technology. In order to estimate the areas needed for the transistors, the numbers used in FIG. 5 are based on a generally used oxide thickness of 13.0 nm (I/O oxide). The perimeter of the conventional cell in FIG. 5 needs a length 501 of about 1107 µm and a width 502 of about 170 µm so that the cell consumes about 188,190 µm$^2$ of circuit area. Comparing this area requirement with the cell area discussed in FIG. 4 for equal discharge current capability, clearly demonstrates that the cell using conventional technology requires more than twice the area needed for a cell of equal capability according to the invention. Included in the area of FIG. 5 are the area for DEnMOS transistor 510; the area for DEnMOS transistor 520; the area for capacitor C$_1$ (530a, 530b, 530c, and 530d); and the areas 531 for resistor R$_1$ and 532 for resistor R$_2$. Transistor 510 needs 300 fingers of 100 µm width each; and transistor 520 has 60 fingers of 100 µm width each. It should be noted that FIG. 5 depicts only a small number of transistor fingers, wherein, for transistor 510, the fingers are designated 511 for source fingers, 513 for drain fingers, and 512 for gate fingers.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors as well as in nMOS transistors to create ESD protection. As another example, the substrate material may include silicon, silicon germanium, gallium arsenide and other semiconductor materials employed in manufacturing.

As yet another example, the dual gate-oxide concept of the invention can be implemented for other ESD cell circuit designs, for instance for level triggering.

It is therefore intended that the appended claims encompass any such modifications or embodiments.

I claim:

1. A device for protecting an input/output (I/O) pad of a semiconductor integrated circuit against electrostatic discharge (ESD) events, comprising:
    a common-source stage tied to the I/O pad, and including a first drain-extended MOS transistor suitable to discharge ESD currents, the first transistor having a gate oxide of a first thickness; and
    a source-follower stage tied to the I/O pad by a trigger, and connected to the common-source stage, the source-follower stage including a second drain-extended MOS transistor having gate oxide of a second thickness,
    wherein the second thickness is greater than the first thickness at least by the amount required to handle the source-follower threshold voltage.

2. The device of claim 1 wherein the first oxide thickness is in the range from 2.0 to 8.5 nm.

3. The device of claim 1 wherein the second oxide thickness is in the range from 4.0 to 20.0 nm.

4. The device of claim 1 wherein the trigger is an RC trigger.

5. The device of claim 1 wherein the trigger is a voltage/level trigger.

6. The device of claim 1 wherein the first and second transistors are nMOS transistors.

7. The device of claim 1 wherein the first and second transistors are pMOS transistors.

8. A device for protecting an input/output (I/O) pad of a semiconductor integrated circuit against electrostatic discharge events, comprising:
    a first MOS transistor having a gate oxide of a first thickness; and
    a second MOS transistor having a gate oxide of a second thickness at least twice as great as the first thickness;
    the first transistor having its drain tied to the I/O pad, its source tied to ground, and its gate tied to the source of the second transistor and resistively connected to ground; and
    the second transistor having its drain tied to the I/O pad, and its gate tied to a capacitor connected to the I/O pad, and to a resistor connected to ground.

9. The device of claim 8 further including a first resistor between ground and the first transistor gate tied to the second transistor source.

10. The device of claim 9 further including a second resistor between ground and the second transistor gate tied to the capacitor.

11. The device of claim 8 wherein the first and second transistors are nMOS transistors.

12. The device of claim 8 wherein the first and second transistors are pMOS transistors.

13. The device of claim 8 wherein the first oxide thickness is in the range from 2.0 to 8.5 nm.

14. The device of claim 8 wherein the second oxide thickness is in the range from 4.0 to 20.0 nm.

* * * * *